(12) United States Patent
Corver

(10) Patent No.: US 7,008,486 B2
(45) Date of Patent: Mar. 7, 2006

(54) CLEANING METHOD FOR NMR CHECK WEIGHING SYSTEM

(75) Inventor: Jozef A. W. M. Corver, Nuenen (NL)

(73) Assignee: The BOC Group, Inc., Murray Hill, NJ (US)

( * ) Notice: Subject to any disclaimer, the term of this patent is extended or adjusted under 35 U.S.C. 154(b) by 0 days.

(21) Appl. No.: 10/836,684

(22) Filed: Apr. 30, 2004

(65) Prior Publication Data

US 2004/0231699 A1 Nov. 25, 2004

Related U.S. Application Data

(60) Provisional application No. 60/471,414, filed on May 16, 2003.

(51) Int. Cl.
*B08B 7/00* (2006.01)
(52) U.S. Cl. .................. 134/1; 134/15; 134/32
(58) Field of Classification Search .......... 134/1, 134/15, 32; 95/28; 209/38, 212, 213, 214, 209/223.1, 225, 239, 240, 241
See application file for complete search history.

(56) References Cited

U.S. PATENT DOCUMENTS

| | | | |
|---|---|---|---|
| 3,796,873 A | 3/1974 | Ledgett | |
| 4,556,847 A * | 12/1985 | Aspiotis et al. | 324/307 |
| 4,727,325 A | 2/1988 | Matsui et al. | |
| 4,884,188 A | 11/1989 | Berkhout et al. | |
| 5,015,954 A | 5/1991 | Dechene et al. | |
| 5,049,819 A | 9/1991 | Dechene et al. | |
| 5,247,317 A | 9/1993 | Corver et al. | |
| 5,291,422 A | 3/1994 | Esztergar | |
| 5,302,894 A | 4/1994 | Hrubes | |
| 5,319,334 A | 6/1994 | Klerken | |
| 5,812,921 A | 9/1998 | Van Reuth et al. | |
| 6,028,428 A | 2/2000 | Cunningham et al. | |
| 6,362,619 B1 | 3/2002 | Prammer et al. | |
| 6,377,049 B1 | 4/2002 | Benz et al. | |
| 6,426,058 B1 | 7/2002 | Pines et al. | |
| 6,759,601 B1 * | 7/2004 | Petty et al. | 177/1 |
| 6,946,838 B1 * | 9/2005 | Corver et al. | 324/307 |

FOREIGN PATENT DOCUMENTS

| | | |
|---|---|---|
| DE | 1803372 A1 | 5/1970 |
| GB | 2149509 A | 6/1985 |
| WO | WO 99/67606 A1 | 12/1999 |

OTHER PUBLICATIONS

Derwent WPI Abstract, UNILEVER NV, Package Weight Measuring System, NL 154001B, Jul. 15, 1977 (Corresponds to DE 1803372A1).

* cited by examiner

*Primary Examiner*—Alexander Markoff
(74) *Attorney, Agent, or Firm*—Ira Zebrak; Bernard Lau

(57) ABSTRACT

A method of cleaning a surface from ferrous particles, in a magnetic resonance apparatus in which a first magnetic field is applied in a first direction in an interrogation zone for creating a net magnetisation within a sample located within the interrogation zone and an alternating magnetic field is applied in a second direction in the interrogation zone for temporarily changing the net magnetisation of the sample located within the interrogation zone, with monitoring of energy emitted by the sample as the net magnetisation of the sample returns to its original state and generating an output signal having a characteristic which is proportional to the energy emitted; the method including disposing in effective proximity to the surface to be cleaned, a permanent magnet cleaning device, the magnet cleaning device being located outside the interrogation zone.

10 Claims, 5 Drawing Sheets

CLEANING METHOD FOR NMR CHECK WEIGHING SYSTEM

CROSS REFERENCE TO RELATED APPLICATIONS

This application claims the benefit of the filing date of U.S. Provisional Application Ser. No. 60/471,414, filed May 16, 2003, which is incorporated herein by reference.

FIELD OF THE INVENTION

The present invention relates to a method of cleaning a surface from ferrous particles in a non-contact check weighing NMR apparatus.

BACKGROUND

The nuclei of atoms that have a magnetic moment will have sharply defined frequencies of nuclear oscillation in a strong magnetic field (Larmor frequency)The frequency of oscillation of each atomic nucleus will depend on its mass, its dipole moment, the chemical bonding of the atom, the atom's environment (which will be affected by electromagnetic coupling to other atoms in the vicinity), and the strength of the magnetic field seen by the atom. Thus, the frequency of oscillation will be characteristic, not only of the various atomic species, but also of their molecular environments. By resonantly exciting these oscillations, the atomic species and their environments can be determined with accuracy. This phenomenon is known as "nuclear magnetic resonance", or NMR.

If a pulse of RF energy is applied at a resonance frequency of atoms of a particular species and environment (e.g. hydrogen atoms in a water environment), the atomic nuclei of this type and environment will resonantly be excited, and will later make a transition back to a low state of excitation. This transition is accompanied by emission of a radio-frequency signal, at the excitation frequency or a known lower frequency. The signal is known as the Free Induction Decay (FID) The amplitude and the shape of this FID-curve is related to the amount of nuclei involved in the process and to specific conditions and properties of the atoms in relation to the environment.

The use of NMR techniques in measurement, detection and imaging has become desirable in many scientific fields of endeavor. The non-invasive, non-destructive nature of NMR has facilitated application to industrial instrumentation, analysis and control tasks.

Almost every element in the periodic table has an isotope with a non-zero nuclear spin. This spin causes the nuclei to be magnetically active. Among magnetically active nuclei, NMR can only be performed on isotopes whose natural abundance is high enough to be detected. Commonly encountered magnetically active nuclei are $^1H$, $^{13}C$, $^{19}F$, $^{23}Na$, and $^{31}P$. The most common is $^1H$, which also possesses the largest magnetic moment, rendering it most advantageous for the performance of NMR spectroscopy.

Upon application to a sample of a static magnetic field, $B_o$, usually with an RF coil, sample nuclei align with the field, parallel to the direction of the field. The magnetic moments can align themselves either parallel (NSNS) or antiparallel (NNSS) to the static field. Alignment parallel to the static field is the lower energy state and alignment against the field is the higher energy state. At room temperature, the number of nuclei having spins in the lower energy level, $N^+$, slightly outnumbers the number in the upper level, $N^-$. Boltzmann statistics provides that $$N^-/N^+ = \exp(-E/kT), \quad (1)$$

where E is the energy difference between the spin states; k is Boltzmann's constant, $1.3805 \times 10^{-23}$ J/Kelvin; and T is the temperature in Kelvin. As the temperature decreases, so does the ratio $N^-/N^+$. As the temperature increases, the ratio approaches unity.

Owing to the slight imbalance of nuclei having spins at the higher state, a sample in a static magnetic field will exhibit a magnetization parallel to the static field. Magnetization results from nuclear precession (relaxation) around the static magnetic field. The frequency of this precession depends on the strength of the static magnetic field, and is defined as:

$$v = \gamma B, \quad (2)$$

where B is the magnetic field strength and Gamma is the gyromagnetic ratio of at least one atom, typically hydrogen, in the sample material. The gyromagnetic ratio is related to the magnetic moment of the nucleus under analysis. The gyromagnetic ratio of protons is 42.57 MHz/Tesla. The frequency thus measured is known as the Larmor frequency, ?, which can be conceptualized as the rate of precession of the nucleus in the static magnetic field or the frequency corresponding to the energy at which a transition between the upper and lower states can take place.

The fundamental NMR signal is derived by inducing transitions between these different alignments. Such transitions can be induced by exposing a sample to the magnetic component of an RF (radio frequency) signal, typically generated by an RF coil. When the magnetic component is applied perpendicularly to the magnetic field a resonance occurs at a particular RF frequency (identical to the precession frequency, the Larmor frequency), corresponding to the energy emitted or absorbed during a transition between the different alignments. When a strong magnetic field, such as in the range of 0.1–2 Tesla (1 T=10,000 Gauss) is used, this resonance typically occurs in the megahertz frequency range, corresponding to FM radio. Hence the radiation is known as Radio Frequency (RF) radiation.

The signal in NMR spectroscopy results from the difference between the energy absorbed by the spins which make a transition from the lower energy state to the higher energy state, and the energy emitted by the spins which simultaneously make a transition from the higher energy state to the lower energy state. The signal is thus proportional to the population difference between the states. NMR spectroscopy gains its high level of sensitivity since it is capable of detecting these very small population differences. It is the resonance, or exchange of energy at a specific frequency between the spins and the spectrometer, which gives NMR its sensitivity.

Pulsed NMR spectroscopy is a technique involving a magnetic burst or pulse, which is designed to excite the nuclei of a particular nuclear species of a sample being measured after the protons of such sample have first been brought into phase in an essentially static magnetic field; in other words the precession is modified by the pulse. Typically, the direction of the static magnetic field, $B_o$, is thought of as being along the Z-axis in three-dimensional space. At equilibrium, the net magnetization vector lies along the direction of the applied magnetic field $B_o$ and is called the equilibrium magnetization $M_o$. In this configuration, the Z component of magnetization $M_Z$ equals $M_o$. $M_Z$ is referred to as the longitudinal magnetization. There is no transverse ($M_X$ or $M_Y$) magnetization in such a case.

It is possible to change the net magnetization by exposing the nuclear spin system to energy of a frequency equal to the energy difference between the spin states. If enough energy is put into the system, it is possible to saturate the spin system and make $M_Z=0$. The time constant, which describes how $M_Z$ returns to its equilibrium value, is called the spin lattice relaxation time ($T_1$). The equation governing this behavior as a function of the time t after its displacement is:

$$M_Z = M_0(1 - e^{-t/T1}) \quad (3)$$

$T_1$ is therefore defined as the time required to change the Z component of magnetization by a factor of e. Hence, at $t=T_1$, $M_Z=0.63\ M_0$. In order to properly perform repeated measurements, which is necessary in order to reduce background noise and enhance signal quality, $M_0$ should be allowed to return to $M_Z$. In other words, the longitudinal magnetization $M_Z$, which equals zero upon saturation, should be allowed to fully return to the +Z direction and attain its equilibrium value of $M_0$. While this theoretically would take forever, (i.e., following saturation, $M_Z=M_0$ when $t=\infty$), it is generally considered sufficient when $M_Z=0.99\ M_0$, which occurs when $t=5T_1$. This places time constraints on the speed at which a sample may be measured multiple times or the overall throughput of samples in an interrogation zone.

If the spin system is oversaturated, forcing the net magnetization into the −Z direction, it will gradually return to its equilibrium position along the +Z axis at a rate also governed by $T_1$. The equation governing this behavior as a function of the time t after its displacement is:

$$M_Z = M_o(1 - 2e^{-t/T1}) \quad (4)$$

The spin-lattice relaxation time ($T_1$) is the time to reduce the difference between the longitudinal magnetization ($M_Z$) and its equilibrium value by a factor of e. Here, too, an elapsed time of $t=5\ T_1$ is required in order for $M_Z$ to return to a value of $0.99\ M_O$, placing a similar time constraint on sample throughput.

If the net magnetization is rotated into the XY plane by a 90° pulse, it will rotate about the Z-axis at a frequency equal to the frequency of a photon, having the energy corresponding to a transition between the two energy levels of the spin. This frequency is called the Larmor frequency. In addition to the rotation, the net magnetization, now in the XY plane, starts to dephase because each of the spin packets making it up is experiencing a slightly different magnetic field and hence rotates at its own Larmor frequency. The longer the elapsed time, following the pulse, the greater the phase difference. If the detector coil is sensitive to measurements of fields in the x-direction alone, the dephasing results in a decaying signal, eventually approaching zero. The time constant, which describes this decay of the transverse magnetization, $M_{XY}$, is called the spin-spin relaxation time, $T_2$.

$$M_{XY} = M_{XY0}e^{-t/T2} \quad (5)$$

$T_2$ is always less than or equal to $T_1$. The net magnetization in the XY plane goes to zero while the longitudinal magnetization grows until $M_0$ returns to the +Z direction. Any transverse magnetization behaves the same way.

The spin-spin relaxation time, $T_2$, is the time to reduce the transverse magnetization by a factor of e. The difference between spin-lattice relaxation and spin-spin relaxation is that the former works to return $M_z$ to $M_0$, while the latter works to return $M_{xy}$ to zero. $T_1$ and $T_2$ were discussed separately above, for clarity. That is, the magnetization vectors are considered to fill the XY plane completely before growing back up along the Z-axis. Actually, both processes occur simultaneously, with the only restriction being that $T_2$ is less than or equal to $T_1$.

Two factors contribute to the decay of transverse magnetization—(1) molecular interactions (said to lead to a pure $T_2$ molecular effect), and (2) variations in $B_o$ (the applied static field), said to lead to an inhomogeneous $T_2$ effect. The combination of these two factors is what actually results in the decay of transverse magnetization. The combined time constant is called "$T_2$ star" and is given the symbol $T_2^*$. The relationship between the $T_2$ from molecular processes and that from inhomogeneities in the magnetic field is $$1/T_2^* = 1/T_2 + 1/T_{2inh}. \quad (6)$$

The source of the inhomogeneities can be natural fluctuations in a field, or imperfections in the magnets generating the field or magnetic contaminants, such as iron or other ferromagnetic metals.

In practice, to actually measure a sample using NMR, a sample is first placed in a static magnetic field, $B_o$, which is the interrogation zone of the instrument. Next, a magnetic pulse is applied, which rotates the magnetization vector to a desired extent, typically 90° or 180°. A 90° pulse, for example, rotates the magnetization vector from the Z-direction into the XY plane resulting in transverse magnetization, $M_{XY}$, as discussed above. After the application of the pulse, there occurs a free induction decay (FID) of the magnetization associated with the excited nuclei.

Traditional Fourier Transform analysis transforms a time domain spectrum (amplitude of magnetization vectors vs. time) into a frequency domain spectrum (frequency vs. relative amplitude), which separates individual frequencies out of a multiphase spectrum. This separation can be used to advantage in studying the nuclei of interest. The duration of the pulses, the time between the pulses, the pulse phase angle and the composition of the sample are parameters, which affect the sensitivity of this technique.

International Patent Application No. WO9967606, incorporated herein by reference as if fully written out below, describes a check weighing system for samples on a production line, including a magnet for creating a static magnetic field over an interrogation zone to create a net magnetization within a sample located within the interrogation zone, and an RF coil for applying an alternating magnetic field over the interrogation zone to cause excitation of the sample according to the principles of NMR.

The use of NMR for techniques for check weighing samples on a production line encounters a variety of difficulties, including but not limited to the presence of interfering species such as metal particles either within the sample container or elsewhere in the system.

A disadvantage of the system is its sensitivity for magnetizable (ferrous) particles. Those particles may come loose from container platforms due to abrasive effects. The particles are carried by the containers, and may deposit on the transport belt that moves the containers through the system. The system is responsive to these deposits by reduction of the signal amplitude at the moment of probing the signal, generating effectively lower mass readings, and therefore erroneous results.

It would be desirable to provide a system and method for minimizing for the above noted potential sources of imprecise measurements for an NMR sample check weighing system.

SUMMARY

The present method relates to check weighing material contained in a container, which is passing along a product filling, i.e. production line, by nuclear magnetic resonance (NMR) techniques.

Although ferrous particles originating elsewhere in or external to the system can be carried over by material containers, such as vials, to the transport mechanism and the interrogation zone, it is desirable to minimize manual cleaning. A magnet assembly is used that maximizes magnetic forces on the ferrous particles to remove them from the transport mechanism.

A method is provided of cleaning a surface from ferrous particles, in a magnetic resonance apparatus in which a first magnetic field is applied in a first direction in an interrogation zone for creating a net magnetisation within a sample located within the interrogation zone and an alternating magnetic field is applied in a second direction in the interrogation zone for temporarily changing the net magnetisation of the sample located within the interrogation zone, with monitoring of energy emitted by the sample as the net magnetisation of the sample returns to its original state and generating an output signal having a characteristic which is proportional to the energy emitted; the method comprising disposing in effective proximity to the surface to be cleaned, a permanent magnet cleaning device, the magnet cleaning device being located outside the interrogation zone.

DETAILED DESCRIPTION

Figure 1:
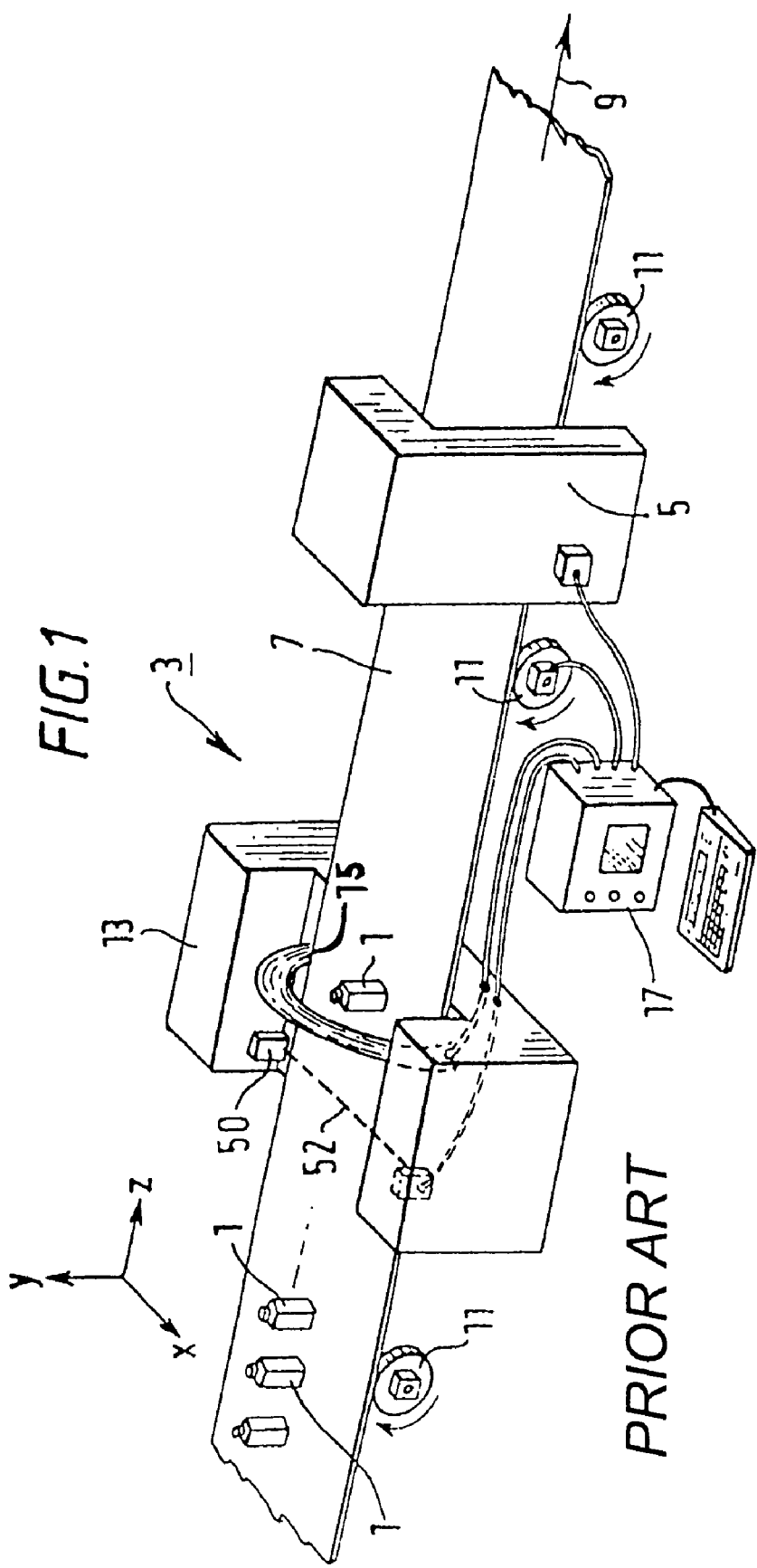
FIG. 1 is a schematic view of a production line with an NMR check weighing station for checking that each container passing through the weighing station has the desired amount of product.

The present method relates to check weighing material contained in a container, which is passing along a production line, by nuclear magnetic resonance (NMR) techniques. As one example, check weighing is used by the pharmaceuticals industry for the monitoring and regulation of the amount of a drug in a sealed glass vial during filling. The drug weight can be as small as a fraction of a gram, and is required to be weighed with an accuracy of a few percent or better, in a vial weighing tens of grams at a rate of several weighings per second. Conventionally, to obtain the required accuracy, it is necessary to remove the vials from the production line and to weigh them on precision balances both before and after filling in order to take into account the weight of the container. Because this is time-intensive, only a fraction of the product can be tested. If deviations from expected values are detected, a large batch of product can be wasted before the problem is identified. As the vial must be weighed both before and after filling, the weighing must be performed in an aseptic environment between filling and sealing.

An NMR apparatus for determining the mass of a sample generally may comprise means for generating a static magnetic field in a first direction through the sample; means for applying an alternating excitation magnetic field in a second different direction through the sample; means for sensing energy emitted by the sample in response to the excitation magnetic field and for outputting a signal in dependence thereon; and means for comparing the signal output by said sensing means with stored calibration data to provide an indication of the mass of the sample. Such an apparatus can be used on-line in a product filling line, i.e. a production line. It can provide a non-contacting measure of the mass of the contents of a container independently of the container mass, if the container is made of a material which is not responsive to NMR, and is useful for determining the mass of small quantities of sample such as samples weighing between 0.1 grams and 10 grams which may be contained in glass containers of 20 grams or more, providing an indication of mass and not weight of the sample.

The apparatus can be used to measure the contents of a container by filling the container with the predetermined amount of sample; transporting each of the filled containers to a weighing station; weighing the sample within each of the containers; sealing the sample within the container; and rejecting any containers which do not contain the predetermined amount of sample within a predetermined tolerance. The weighing of the sample includes generating a static magnetic field in a first direction in an interrogation zone for creating a net magnetization within a sample located within the interrogation zone; applying a pulse of alternating magnetic field in a second different direction in the interrogation zone for temporarily changing the net magnetization of the sample located within the interrogation zone; sensing energy emitted by the sample as the net magnetization of the sample returns to its original state and outputting a signal in dependence thereon; and comparing the signal output by the sensing step with calibration data which relates the mass of at least one similar sample of known mass to the corresponding signal output by the sensing step, to provide the indication of the mass of the sample within each container.

In addition to pharmaceuticals, such an apparatus and method can be used in a variety of applications, including but not limited to cosmetics, perfumes, industrial chemicals, biological samples and food products. It can measure high value products where 100% sampling can reduce wastage, and can be used to determine the mass of samples that are in solid form, in powder form, in liquid form and in gas form, or any combination thereof.

FIG. 1 shows a portion of a production line, which fills glass vials 1 with a drug sample. Included is a weighing station 3 that is provided "in-line" for weighing each of the filled vials that pass therethrough, and a reject station 5 that removes those vials from the line that do not have the sufficient amount of the drug to meet product specifications. The vials 1 are transported to the weighing station 3 from a filling (and optionally sealing) station (not shown) by a conveyor belt 7 which, as represented by the arrow 9, moves in the z direction through the action of rotating conveyor wheels 11. The weighing station uses NMR techniques to determine the mass of the drug sample within each of the glass vials 1. As those skilled in the art will appreciate, glass vials are useful as the container, because they do not give a signal that might interfere with the measurement process. In this embodiment, the weighing station 3 comprises a permanent magnet 13, an RF coil 15 and a computer control system 17. The magnet 13 is creates a homogeneous direct current (DC) or static magnetic field in the x direction across the conveyor belt 7. The sample in the glass vial contains nuclei which each possess a magnetic moment, e.g. 1H nuclei (protons). This magnetic moment, discussed above, is a result of the spin of the nuclei.

In most NMR systems, the static magnetic field strength is such that the Larmor frequency of the sample is in the radio frequency range of the electromagnetic spectrum. Applying an alternating current (AC) magnetic field to the sample at the sample's Larmor frequency and orientated orthogonal to the static magnetic field, will cause the sample's net magnetization to rotate about the AC magnetic field's axis, away from the direction of the static field. In this embodiment, this magnetic field is generated by applying a corresponding AC current to the RF coil 15. The angle of rotation of the net magnetization can be varied by varying the amount of energy delivered to the RF coil 15.

In this exemplified embodiment, an excitation field that causes a 90° rotation is used to excite the sample. After the 90° pulse has been applied to the sample, the sample is left in a high-energy, non-equilibrium state, from which it will relax back to its equilibrium state. As it relaxes, electromagnetic energy at the Larmor frequency is emitted, the magnetic component of which induces current in the RF coil 15, the amplitude of which varies with, among other things, the number of magnetic moments in the sample and hence the number of molecules in the sample. The received signal is then passed to the computer control system 17, which compares the peak amplitude of the signal received from the unknown sample, with the peak amplitude of a signal received from a calibration sample with a known mass (or weight), to determine the mass (or weight) of the sample being tested. The check weighing station 3 may be able to generate and receive signals at different Larmor frequencies needed to be able to excite different NMR responsive elements in samples. If the computer control system 17 can store calibration data for each of the different samples, then the check weighing station would be able to determine the mass of various samples using the NMR signals from the different NMR responsive elements.

As described in the embodiments above, the RF probe monitors the energy emitted by the sample as the net magnetisation of the sample returns to its original state of equilibrium, and generates an output signal having a characteristic that is proportional to the energy emitted, such as current amplitude. The computer control system receives the RF probe output signal. A processor compares the current amplitude or other output signal characteristic with like data obtained from at least one similar sample of known mass, and determines the mass of the sample from the results of the comparison. It is to be understood that although for purposes of illustration the embodiment has been described as measuring the peak amplitude of the induced signal, any chemometric characterization technique can be used that derives a single value from the energy emitted and the output signal generated. In general, comparison techniques may include comparing the FID characteristics of the sample with like FID characteristics of at least one known sample, i.e., the calibration data.

A system is described above in which NMR (or MRI) technology is used to determine the mass of the contents of containers on a continuous basis. According to the method, material is transported into a magnetic field to be magnetized. A coil structure is used to emit electromagnetic radiation that excites the material. The same coil receives the subsequent decay signal, called Free Induction Decay (FID). The advantage of the system is that the measurement is nondestructive and that the measurement taking is fast enough to enable 100% protocolling. The system is not influenced by airflows of the surrounding environment. The system includes a permanent magnet adapted for creating a magnetic field of roughly 0.17 T in the center of the volume. Between the poles of the magnet, the coil structure is fitted. This coil acts as a transmitter and receiver of electromagnetic radiation. The coil structure is adapted to minimize airflow disturbance.

Due to accumulation of ferrous particles on the transport mechanism or belt of the NMR check weigher measurement system, the effective homogeneity of the magnet field is disturbed. Especially, particles that are close to the material or product that is being measured, greatly influence the measurement of weight. Inhomogeneity of the magnet field results in a more rapid decay of the FID, and therefore the measured amplitude is lower. Since it is highly unlikely that the spread of particles over the belt is homogeneous, an additional spread of measurement results will occur. This is a situation that is desired to be avoided. Instead of regular cleaning and the associated validation issues regarding frequency of cleaning and procedures, it is desirable to use a permanent cleaning device that creates a stable situation.

Figure 2:
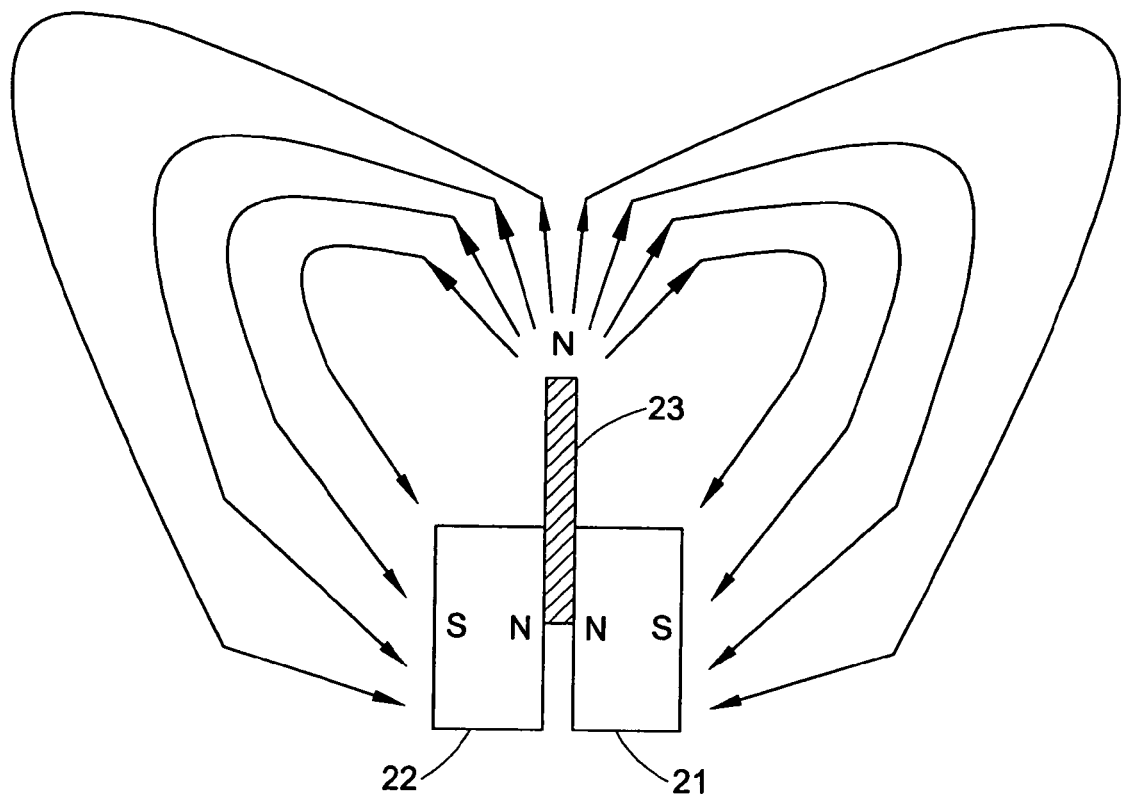
FIG. 2 is a schematic representation of a magnet structure for collecting ferrous particles.

In order to avoid the inaccuracies in measurement caused by reduction of the signal amplitude at the moment of probing the signal, generating effectively lower mass readings, due to the presence of ferrous particles on the transport mechanism in the interrogation zone, the subject method is utilized. Because the ferrous particles are magnetizable, a magnet structure is provided that is specially adapted to collect the particles. A schematic diagram of the magnet structure is shown in FIG. 2.

In one embodiment, the magnet comprises two pieces of Nd—Fe—B permanent magnet material 21,22 that is magnetized to saturation. The pieces may be glued with a thin layer of adhesive, such as an epoxy resin, to a soft-iron strip or so-called "mu-metal" 23, with the pole direction as indicated in FIG. 2. The field strength that results from this configuration is limited by the permeability of the iron strip and is of the order of about 2 T. Additionally, the magnetic field gradient, proportional to the magnetic force, is very high, of the order of about 10 T/mm. It is this force that can be used to pull the ferrous particles from the transport mechanism, or belt. This configuration can be permanently or semi-permanently (to allow for cleaning of the magnet) fitted to the arrangement of the NMR measuring system, assuring the belt to be clean of ferrous particles.

One of the consequences of Maxwell's laws is that magnetic force is linearly proportional to magnetization of an object and the gradient of the external field. To maximize the magnetic force on ferrous particles and optimize cleaning, it is therefore desired to provide a magnet device having a maximum field gradient.

A magnet that is suitable for use in the subject method is described in U.S. Pat. No. 4,884,188 to Berkhout et al., U.S. Pat. No. 5,247,317 to Corver et al., U.S. Pat. No. 5,319,334 to Klerken, and U.S. Pat. No. 5,812,921 to Van Reuth et al., (all incorporated herein by reference, as if fully rewritten below) for use in photocopiers. In that application, such a magnet it is used to attract toner particles (powder ink) that contain a little amount of ferrous material. In the present application, the magnet device is able to clean and collect ferrous particles that adhere to the product container transport belt. The magnetic force has to overcome the adhesion forces between the ferrous particles and the transport belt. Since the gradient is very high, the influence distance of this magnetic force is small. It is therefore desirable to dispose the magnet device as close as practical to the belt.

The cleaning magnet generates an extremely high magnetic field gradient. There is present an extremely high initial magnetic field, at the surface of the magnet, a field on the order of about 2 T, which is the saturation value of the mu metal being applied, and the field gradient. Since the gradient very high, the field dies out very quickly. Therefore, the placement of the cleaning magnet to the surface to be cleaned, such as the conveyor belt or other elements of a sample transport mechanism, should be at very close proximity. In certain embodiments, the surface of the cleaning magnet is no more than about 200 microns maximum distance from the surface to be cleaned.

Figure 3:
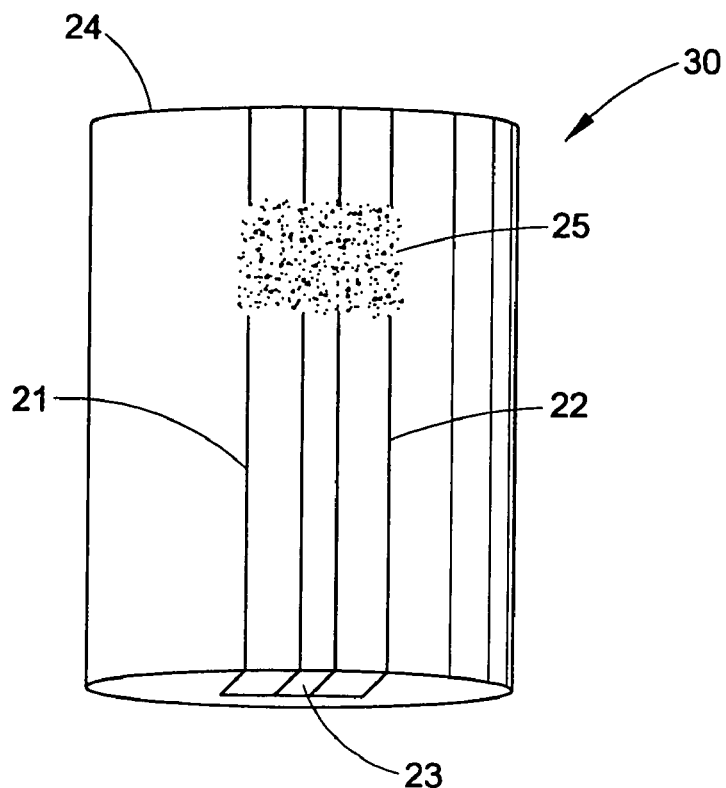
FIG. 3 is a schematic diagram of one embodiment of a cleaning magnet device.

FIG. 3 is a schematic diagram of one embodiment of a cleaning magnet device 30 comprising a cylindrical aluminum holder 24 for the magnet pieces, which are disposed generally in a recess in the holder. The two magnets 21,22 flank the mu-metal strip 23, which is disposed between the magnet pieces. Ferrous particles 25 are collected by the cleaning magnet device.

Figure 4:
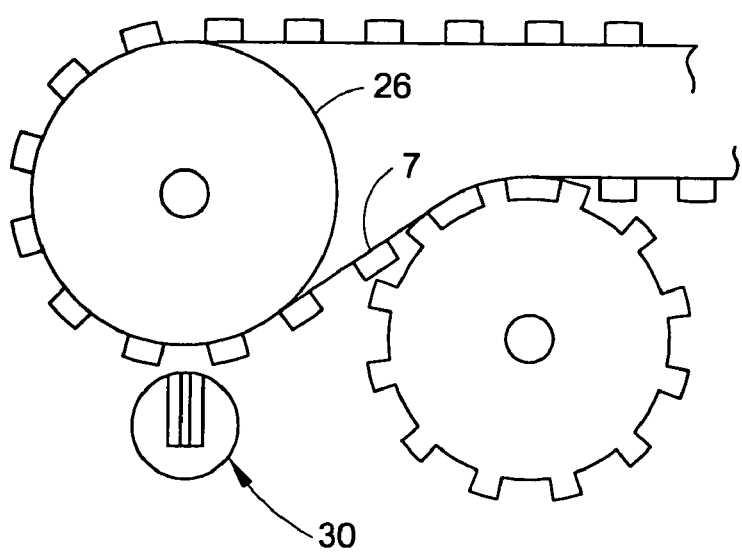
FIG. 4 is a schematic diagram of a cleaning magnet device positioned in close proximity to a conveyor belt of an NMR measuring system.
Figure 5:
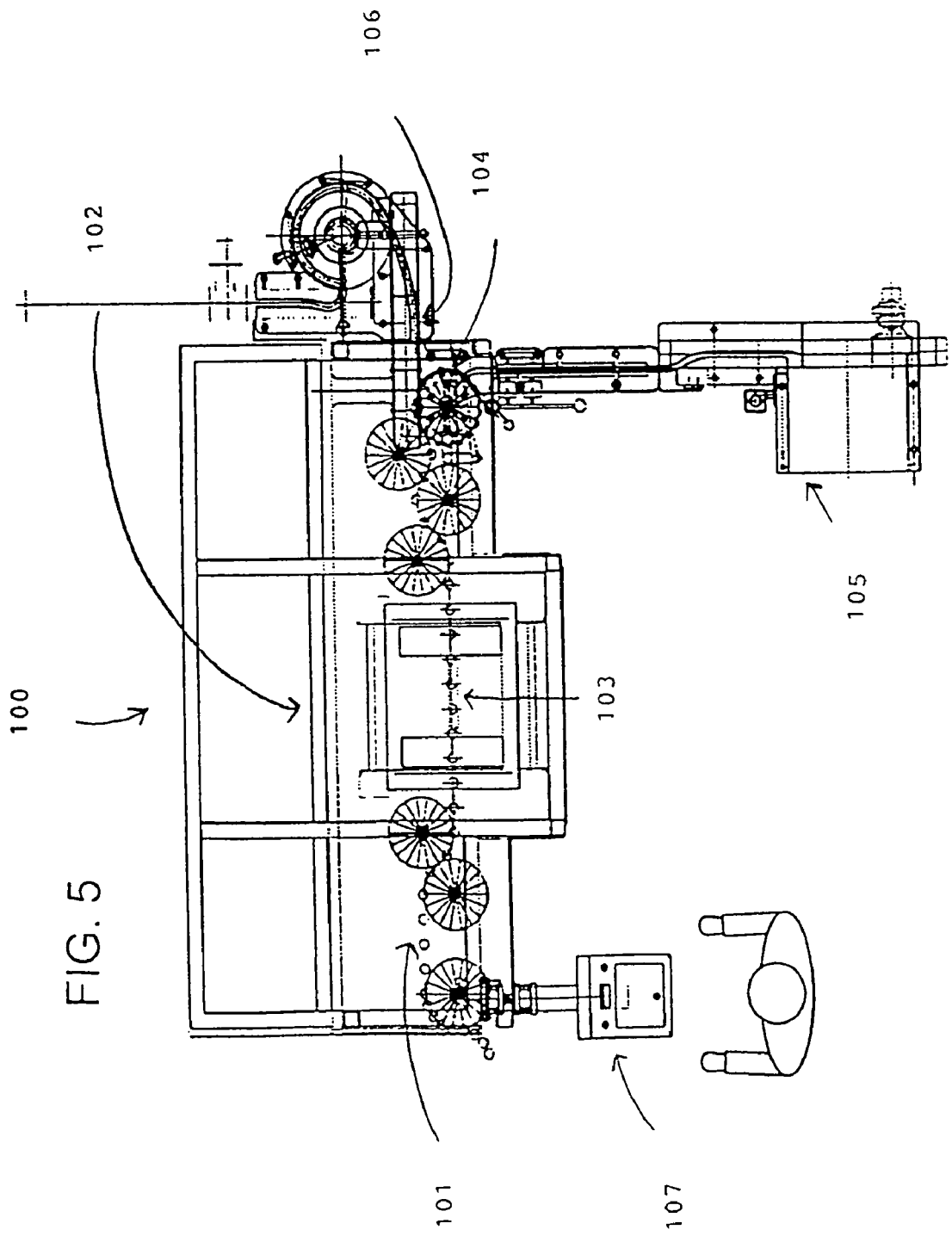
FIG. 5 is a schematic plan view of an NMR measuring system.

FIG. 4 is a schematic diagram of a cleaning magnet device positioned in close proximity to a conveyor belt 7 of an NMR measuring apparatus, shown schematically in FIG. 5. FIG. 5 shows a schematic plan view of a production line with an NMR check weighing station. Generally, the check weighing station 100 includes an in-feed section 101 comprising a conveyor belt or other transport mechanism, the check weighing section, or probe, 102 containing the magnet, RF antenna and in part defining the interrogation zone 103, a reject section 104 leading to a reject buffer 105, and an out-feed section 106. The check weighing station may contain an operator panel 107.

Figures 6A, 6B:
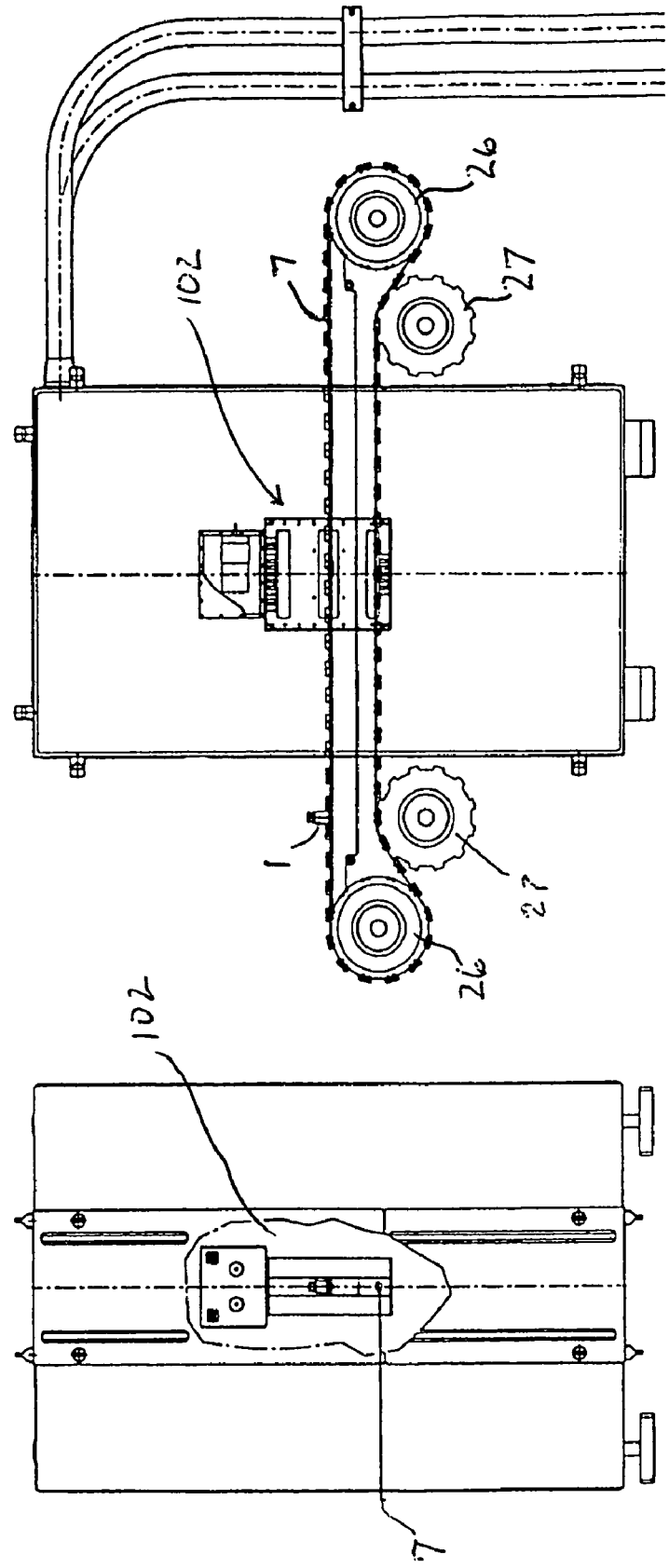
FIG. 6A is a cross-sectional bottom plan view of the NMR probe containing compartment with the conveyor belt return outside the probe.
FIG. 6B is a cross sectional side elevation view of the NMR probe containing compartment with the conveyor belt extending through the interrogation zone with drive wheels and wheels for counter-flexing the conveyor belt to eliminate belt speed fluctuations.

FIG. 6A shows a cross-sectional bottom plan view of the NMR probe 102 containing compartment with the conveyor belt 7 return inside the probe 102. FIG. 6B shows a cross sectional side elevation view of the NMR probe 102 containing compartment with the conveyor belt 7 extending through the interrogation zone 103 with drive wheels 26 and wheels 27 for counter-flexing the conveyor belt 7 to eliminate belt speed fluctuations. The cleaning magnet device shown in FIG. 4 may be in proximity to the conveyor belt 7 as it engages a wheel 26 or 27.

The magnet structure can thus be applied in practically any situation in the NMR measuring system where ferrous particles need to be removed in a non-contact way, subject to suitable displacement from the interrogation zone.

The cleaning magnet device must not interfere with the interrogation zone of the NMR system. In certain embodiments, the cleaning magnet is positioned at least outside the IG zone of the NMR system magnet. The field gradient of the cleaning magnet device is so high, that within a distance of 10 cm its influence on the NMR field gradient can be substantially neglected. In certain embodiments, the cleaning magnet device is positioned at least 10 cm away from the IG line of the NMR system magnet.

The cleaning magnet is constantly operational to perform the ferrous particle cleaning function. Although the build-up of ferrous particles will not be excessive in clean-room conditions, it can be removable from the system in any way to remove excess ferrous particles, from time to time.

Although the invention has been described in detail through the above detailed description and the preceding examples, these examples are for the purpose of illustration only and it is understood that variations and modifications can be made by one skilled in the art without departing from the spirit and the scope of the invention. It should be understood that the embodiments described above are not only in the alternative, but can be combined.

What is claimed is:

1. A method of cleaning a surface of a transport mechanism from ferrous particles, in a magnetic resonance technique check weighing apparatus in which a first magnetic field is applied in a first direction in an interrogation zone for creating a net magnetisation within a sample located within the interrogation zone and an alternating magnetic field is applied in a second direction in the interrogation zone for temporarily changing the net magnetisation of the sample located within the interrogation zone, with monitoring of energy emitted by the sample as the net magnetisation of the sample returns to its original state and generating an output signal having a characteristic which is proportional to the energy emitted;

the method comprising disposing in effective proximity to the surface of the transport mechanism to be cleaned, a permanent magnet cleaning device, the magnet cleaning device being located outside the interrogation zone so as not to interfere with the interrogation zone.

2. The method of claim 1, wherein the surface of the transport mechanism to be cleaned is a conveyor of the sample to the interrogation zone.

3. The method of claim 2 wherein the cleaning magnet device is positioned at least outside the 1G zone of the interrogation zone magnetic resonance magnet.

4. The method of claim 2 wherein the cleaning magnet device is located at least about 10 cm away from the 1G line of the interrogation zone magnetic resonance magnet.

5. The method of claim 1 wherein the cleaning magnet device comprises two pieces of permanent magnet material that is magnetized to saturation, flanking a mu-metal strip.

6. The method of claim 5, wherein the permanent magnet material comprises Nd—Fe—B, and the mu metal strip is iron.

7. The method of claim 1, wherein the permanent magnet cleaning device generates at the surface of the magnet, a field strength on the order of about 2T.

8. The method of claim 1, wherein the permanent magnet cleaning device generates a magnetic field gradient on the order of about 10T/mm.

9. The method of claim 1 wherein the magnet cleaning device is disposed no more than about 200 microns from the surface of the transport mechanism to be cleaned.

10. The method of claim 6 wherein the permanent magnet material is substantially disposed within a recess of a generally cylindrical aluminum holder.

* * * * *